United States Patent
Subramaniam et al.

(10) Patent No.: US 12,413,065 B2
(45) Date of Patent: Sep. 9, 2025

(54) MOTOR DISCONNECTION DETECTION WHILE THE MOTOR IS SWITCHED ON

(71) Applicant: Lennox Industries Inc., Richardson, TX (US)

(72) Inventors: Palanivel Subramaniam, Richardson, TX (US); Yan Yang, Wylie, TX (US)

(73) Assignee: Lennox Industries Inc., Richardson, TX (US)

( * ) Notice: Subject to any disclaimer, the term of this patent is extended or adjusted under 35 U.S.C. 154(b) by 251 days.

(21) Appl. No.: 18/340,963

(22) Filed: Jun. 26, 2023

(65) Prior Publication Data
US 2024/0429699 A1    Dec. 26, 2024

(51) Int. Cl.
  *H02P 21/06* (2016.01)
  *G01R 19/165* (2006.01)
  *H02H 3/087* (2006.01)

(52) U.S. Cl.
  CPC ....... *H02H 3/087* (2013.01); *G01R 19/16571* (2013.01)

(58) Field of Classification Search
  CPC ........ H02H 3/087; H02H 7/08; G01R 31/343; H02P 29/024; H02P 29/0241
  See application file for complete search history.

(56) References Cited

U.S. PATENT DOCUMENTS

| | | | |
|---|---|---|---|
| 2010/0026216 A1* | 2/2010 | Atarashi | H02P 21/22 318/400.02 |
| 2016/0164449 A1* | 6/2016 | Park | B60H 1/00857 165/11.2 |
| 2017/0234556 A1* | 8/2017 | Becerra | F04D 27/001 318/400.09 |
| 2022/0278524 A1* | 9/2022 | Scaramucci | B60L 3/0046 |

* cited by examiner

*Primary Examiner* — Muhammad S Islam
(74) *Attorney, Agent, or Firm* — Baker Botts L.L.P.

(57) ABSTRACT

A system for detecting motor disconnections while a motor is switched on comprises a motor, a motor drive circuit, and a processor. The processor determines whether a set of disconnection conditions is met for more than a threshold time. In this process, the processor determines that a pulse signal that leads to power the motor is enabled, that a speed associated with the motor is more than a threshold speed, a drive voltage output associated with the motor drive circuit is more than a threshold voltage, a current applied to the motor is less than a threshold current, and that the speed associated with the motor is zero. The processor determines that at least one terminal of the motor is disconnected from the motor drive circuit in response to determining that the set of disconnection conditions is met for more than the threshold time.

20 Claims, 6 Drawing Sheets

MOTOR DISCONNECTION DETECTION WHILE THE MOTOR IS SWITCHED ON

TECHNICAL FIELD

The present disclosure relates generally to heating, ventilation, and air conditioning (HVAC) systems and methods of their use, and more specifically to motor disconnection detection while the motor is switched on.

BACKGROUND

Heating, ventilation, and air conditioning (HVAC) systems are used to regulate environmental conditions within an enclosed space. Typically, HVAC systems include an evaporator coil and a condenser coil. A blower of the HVAC system pulls warm air from the enclosed space and pushes the air across the evaporator coil to cool the air. The air is cooled via heat transfer with refrigerant flowing through the evaporator coil and returned to the enclosed space as conditioned air. Meanwhile, the refrigerant flowing through the evaporator is heated and generally transitions to the vapor phase. After being pressurized by a compressor, the refrigerant from the evaporator coil flows toward the condenser coil where it is cooled before flowing back to the evaporator coil to repeat the cycle. These components of the HVAC system are run by motors. Motors may be disconnected from one or more terminals. If disconnected, the motor and motor-driven components may become unstable.

SUMMARY

The system described in the present application provides several practical applications and technical advantages that overcome the current technical problems described herein. The following disclosure is particularly integrated into a practical application of detecting motor disconnection at one or more motor terminals in cases where the motor is switched off and in cases where the motor is switched on. This, in turn, provides an additional practical application of improving the operation of the motor and other components that the motor is tasked to operate. For example, in a Heating, Ventilation, and Air Conditioning (HVAC) system, a motor may be tasked to power a fan, a blower, a compressor, or other components of the HVAC system. If the motor disconnection is left undetected, the motor-driven component (e.g., the fan, the blower, the compressor, etc.) may not operate as intended and/or unstable or irregular voltage/current coming from the motor may damage the motor-driven component. By detecting the motor disconnection, the disconnection may be addressed by an operator. Thus, the operations of the motor and the motor-driven component are improved.

In some cases, a terminal (e.g., any of the terminals a, b, c) of the motor may be disconnected due to hardware and/or software malfunctions. The current approaches do not provide a solution to detect motor disconnection. In other words, using the current approaches, it is not known whether the motor is disconnected, much less the location of the disconnection, which motor terminal or from which side of the motor—from the frontend or the backend.

The disclosed system is configured to provide a technical solution to the technical problem discussed above and other technical problems arising in HVAC technology. For example, the disclosed system is configured to provide a method to detect disconnection at one or more terminals of the motor. In certain embodiments, the disclosed system is configured to detect the motor disconnection while the motor is switched off (e.g., before it is running). In certain embodiments, the disclosed system is configured to detect the motor disconnection while the motor is switched on.

Motor Disconnection Detection while the Motor is Switched Off

In some embodiments, a system for detecting motor disconnection at motor terminals before the motor is switched on comprises a motor, a motor drive circuit, and a processor. The motor is configured to operate a motor-driven component, wherein the motor has three terminals communicatively coupled to the motor-driven component. The motor drive circuit is configured to power the motor. The processor is communicatively coupled with the motor drive circuit. The processor is configured to determine whether a pulse signal that powers the motor is enabled. The processor is further configured to determine whether a permanent magnet associated with the motor is being aligned with at least one winding associated with the motor in response to determining that the pulse signal is enabled. The processor is further configured to communicate, to the motor drive circuit, a control signal that indicates to transmit a DC voltage signal to a first terminal from among the terminals at the motor in response to determining that the permanent magnet is being aligned with at least one winding. The processor is further configured to determine a first current value at the first terminal of the motor. The processor is further configured to compare the first current value with a first threshold current value. The processor is further configured to determine that the first current value is less than the first threshold current value. The processor is further configured to determine that the first terminal of the motor is disconnected from the motor drive circuit in response to determining that the first current value is less than the first threshold current value.

Motor Disconnection Detection while the Motor is Switched on

In some embodiments, a system for detecting motor disconnection at motor terminals while the motor is switched on comprises a motor, a motor drive circuit, and a processor. The motor is configured to operate a motor-driven component. The motor drive circuit is configured to power the motor. The processor is communicatively coupled to the motor drive circuit. The processor is configured to determine whether a set of disconnection conditions is met for more than a threshold time. The processor is further configured to determine that a pulse signal that leads to powering the motor is enabled. The processor is further configured to determine that a speed associated with the motor is more than a threshold speed, wherein the speed associated with the motor is a modeled speed determined from a circuit model that represents the motor. The processor is further configured to determine whether a drive voltage output associated with the motor drive circuit is more than a threshold voltage. The processor is further configured to determine that a current applied to the motor is less than a threshold current. The processor is further configured to determine that the speed associated with the motor is zero. The processor is further configured to determine that at least one terminal of the motor is disconnected from the motor drive circuit in response to determining that the set of disconnection conditions is met for more than the threshold time.

Certain embodiments of this disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 2 illustrates a diagram of an example system configured to detect motor disconnection while a motor is switched off and while it is switched on;

FIG. 6 illustrates a flowchart of an example method for detecting motor disconnections when the motor is switched on.

DETAILED DESCRIPTION

As described above, previous technologies fail to provide an efficient, secure, and reliable solution for detecting motor disconnections at terminals of motors, for example, motors used in Heating, Ventilation, and Air Conditioning (HVAC) systems). Embodiments of the present disclosure and its advantages may be understood by referring to FIGS. 1 through 6. FIGS. 1 through 6 are used to describe systems and methods for detecting motor disconnections at terminals of motors before the motor is switched on and while the motor is switched on.

System Overview

Figure 1:
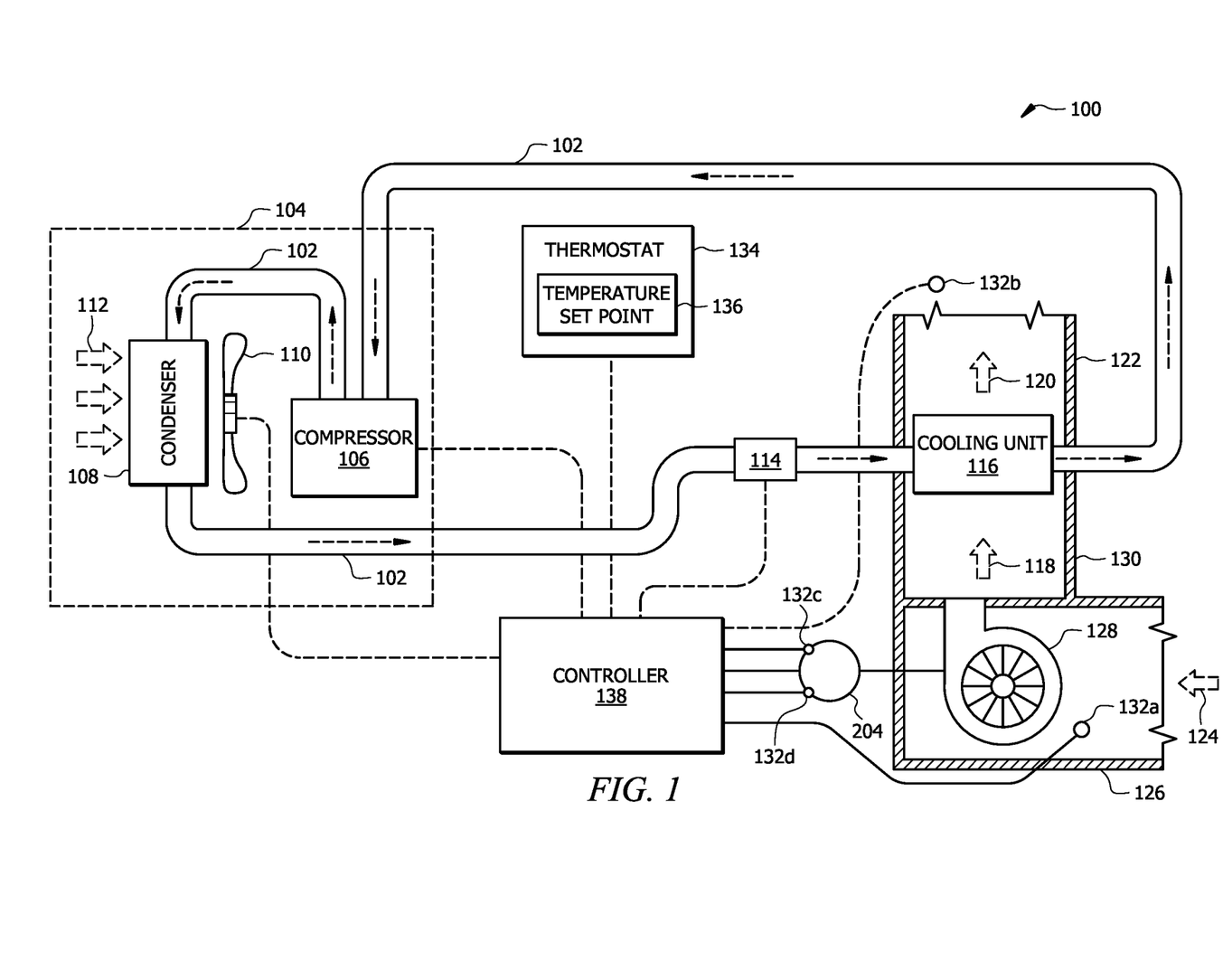
FIG. 1 illustrates a diagram of an example HVAC system which includes motor-driven components.

FIG. 1 illustrates a schematic diagram of an embodiment of an HVAC system 100. The HVAC system 100 conditions air for delivery to a conditioned space. Various components of the HVAC system 100 may be motor-driven components including, but not limited to, the compressor 106, the fan 110, and the blower 128, described in greater detail below. The conditioned space may be, for example, a room, a house, an office building, a warehouse, or the like. In some embodiments, the HVAC system 100 is a rooftop unit (RTU) that is positioned on the roof of a building and the conditioned air is delivered to the interior of the building. In other embodiments, portion(s) of the system may be located within the building and portion(s) outside the building. The HVAC system 100 may also include heating elements that are not shown here for convenience and clarity. The HVAC system 100 may be configured as shown in FIG. 1 or in any other suitable configuration. For example, the HVAC system 100 may include additional components or may omit one or more components shown in FIG. 1.

The HVAC system 100 includes a working-fluid conduit subsystem 102, a condensing unit 104, an expansion valve 114, a cooling unit 116, a thermostat 134, and a controller 138. The working fluid conduit subsystem 102 facilitates the movement of a working fluid (e.g., a refrigerant) through a cooling cycle such that the working fluid flows as illustrated by the dashed arrows in FIG. 1. The working fluid may be any acceptable working fluid including, but not limited to, fluorocarbons (e.g., chlorofluorocarbons), ammonia, non-halogenated hydrocarbons (e.g., propane), hydroflurocarbons (e.g., R-410A), or any other suitable type of refrigerant.

The condensing unit 104 includes a compressor 106, a condenser 108, and a fan 110. The compressor 106 is coupled to the working-fluid conduit subsystem 102 and compresses (i.e., increases the pressure of) the working fluid. The compressor 106 of condensing unit 104 may be a variable speed or multi-stage compressor. A variable speed compressor is generally configured to operate at different speeds to increase the pressure of the working fluid to keep the working fluid moving along the working-fluid conduit subsystem 102. In the variable speed compressor configuration, the speed of compressor 106 can be modified to adjust the cooling capacity of the HVAC system 100. Meanwhile, a multi-stage compressor may include multiple compressors, each configured to operate at a constant speed to increase the pressure of the working fluid to keep the working fluid moving along the working-fluid conduit subsystem 102. In the multi-stage compressor configuration, one or more compressors can be turned on or off to adjust the cooling capacity of the HVAC system 100.

The compressor 106 is in signal communication with the controller 138 using a wired or wireless connection. The controller 138 provides commands or signals to control the operation of the compressor 106. For example, the controller 138 may operate the compressor 106 in different modes corresponding to load conditions (e.g., the amount of cooling or heating required by the HVAC system 100). As described in greater detail with respect to FIG. 2 below, the compressor 106 may be a motor-driven component. Accordingly, the controller 138 may provide a signal to a motor-drive circuit which powers a motor associated with the compressor 106. The controller 138 is described in greater detail below with respect to FIG. 2.

The condenser 108 is generally located downstream of the compressor 106 and is configured to remove heat from the working fluid. The fan 110 is configured to move air 112 across the condenser 108. For example, the fan 110 may be configured to blow outside air through the condenser 108 to help cool the working fluid flowing therethrough. The fan 110 may be in signal communication with the controller 138 using a wired or wireless connection such that the controller 138 provides commands or signals to control the operation of the fan 110. The fan 110 may be a motor-driven component. The controller 138 may provide a signal to a motor-drive circuit which powers a motor associated with the fan 110. The cooled working fluid from the condenser 108 flows toward an expansion valve 114.

The expansion valve 114 is coupled to the working-fluid conduit subsystem 102 downstream of the condenser 108 and is configured to remove pressure from the working fluid. In this way, the working fluid is delivered to the cooling unit 116 and receives heat from airflow 118 to produce a conditioned airflow 120 that is delivered by a duct subsystem 122 to the conditioned space. In general, the expansion valve 114 may be a valve such as an expansion valve or a flow control valve (e.g., a thermostatic expansion valve (TXV) valve) or any other suitable valve for removing pressure from the working fluid while, optionally, providing control of the rate of flow of the working fluid. The expansion valve 114 may be in communication with the controller 138 (e.g., via wired and/or wireless communication) to receive control signals for opening and/or closing associated valves.

The cooling unit 116 is generally any heat exchanger configured to provide heat transfer between air flowing through the cooling unit 116 (i.e., contacting an outer surface of one or more evaporator coils associated with the cooling unit 116) and working fluid passing through the interior of the cooling unit 116. The cooling unit 116 is fluidically connected to the compressor 106, such that working fluid generally flows from the cooling unit 116 to the compressor 106.

A portion of the HVAC system 100 is configured to move air 118 across the cooling unit 116 and out of the duct sub-system 122 as conditioned air 120. Return air 124, which may be air returning from the building, fresh air from outside, or some combination, is pulled into a return duct 126. A suction side of the blower 128 pulls the return air 124 through the duct 126. The blower 128 discharges airflow 118 into a duct 130 from where the airflow 118 crosses the cooling unit 116 or heating elements (not shown) to produce the conditioned airflow 120. The blower 128 is any mechanism for providing a flow of air through the HVAC system 100. For example, the blower 128 may be a constant-speed or variable-speed circulation blower or fan. Examples of a variable-speed blower include, but are not limited to, belt-drive blowers controlled by inverters, direct-drive blowers with electronic commuted motors (ECM), or any other suitable types of blowers.

The blower 128 is in signal communication with the controller 138 using any suitable type of wired or wireless connection. The controller 138 is configured to provide commands or signals to the blower 128 to control its operation. The blower 128 may be a motor-driven component. The controller 138 may provide a signal to a motor-drive circuit which powers a motor associated with the blower 128.

The HVAC system 100 generally includes one or more sensors 132a,b in signal communication with the controller 138. The sensors 132a,b may include any suitable type of sensor for measuring air temperature as well as other properties of a conditioned space (e.g., a room or building). The sensors 132a,b may be positioned anywhere within the conditioned space, the HVAC system 100, and/or the surrounding environment. For example, as shown in the illustrative example of FIG. 1, the HVAC system 100 may include a sensor 132a positioned and configured to measure a return air temperature (e.g., of airflow 124) and a sensor 132b positioned and configured to measure a supply or treated air temperature (e.g., of airflow 120). In other examples, the HVAC system 100 may include sensors positioned and configured to measure any other suitable type of air temperature (e.g., the temperature of air at one or more locations within the conditioned space and/or an outdoor air temperature).

The HVAC system 100 includes one or more thermostats 134, for example, located within the conditioned space (e.g., a room or building). The thermostat 134 is generally in signal communication with the controller 138 using any suitable type of wired or wireless communications. The thermostat 134 may be a single-stage thermostat, a multi-stage thermostat, or any suitable type of thermostat as would be appreciated by one of ordinary skill in the art. The thermostat 134 is configured to allow a user to input a desired temperature via a temperature setpoint 136 for a designated space or zone such as a room in the conditioned space. The controller 138 may use information from the thermostat 134 such as the temperature setpoint 136 for controlling the compressor 106, the fan 110, and/or the blower 128.

As described above, in certain embodiments, connections between various components of the HVAC system 100 are wired. For example, conventional cable and contacts may be used to couple the controller 138 to the various components of the HVAC system 100, including, the compressor 106, the fan 110, the expansion valve 114, the blower 128, sensor(s) 132, and thermostat 134. In some embodiments, a wireless connection is employed to provide at least some of the connections between components of the HVAC system 100. In some embodiments, a data bus couples various components of the HVAC system 100 together such that data is communicated therebetween. In a typical embodiment, the data bus may include, for example, any combination of hardware, software embedded in a computer readable medium, or encoded logic incorporated in hardware or otherwise stored (e.g., firmware) to couple components of HVAC system 100 to each other. As an example and not by way of limitation, the data bus may include an Accelerated Graphics Port (AGP) or other graphics bus, a Controller Area Network (CAN) bus, a front-side bus (FSB), a HYPERTRANSPORT (HT) interconnect, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or any other suitable bus or a combination of two or more of these. In various embodiments, the data bus may include any number, type, or configuration of data buses, where appropriate. In certain embodiments, one or more data buses (which may each include an address bus and a data bus) may couple the controller 138 to other components of the HVAC system 100.

Example Motor Disconnection Detection System

Figure 2:
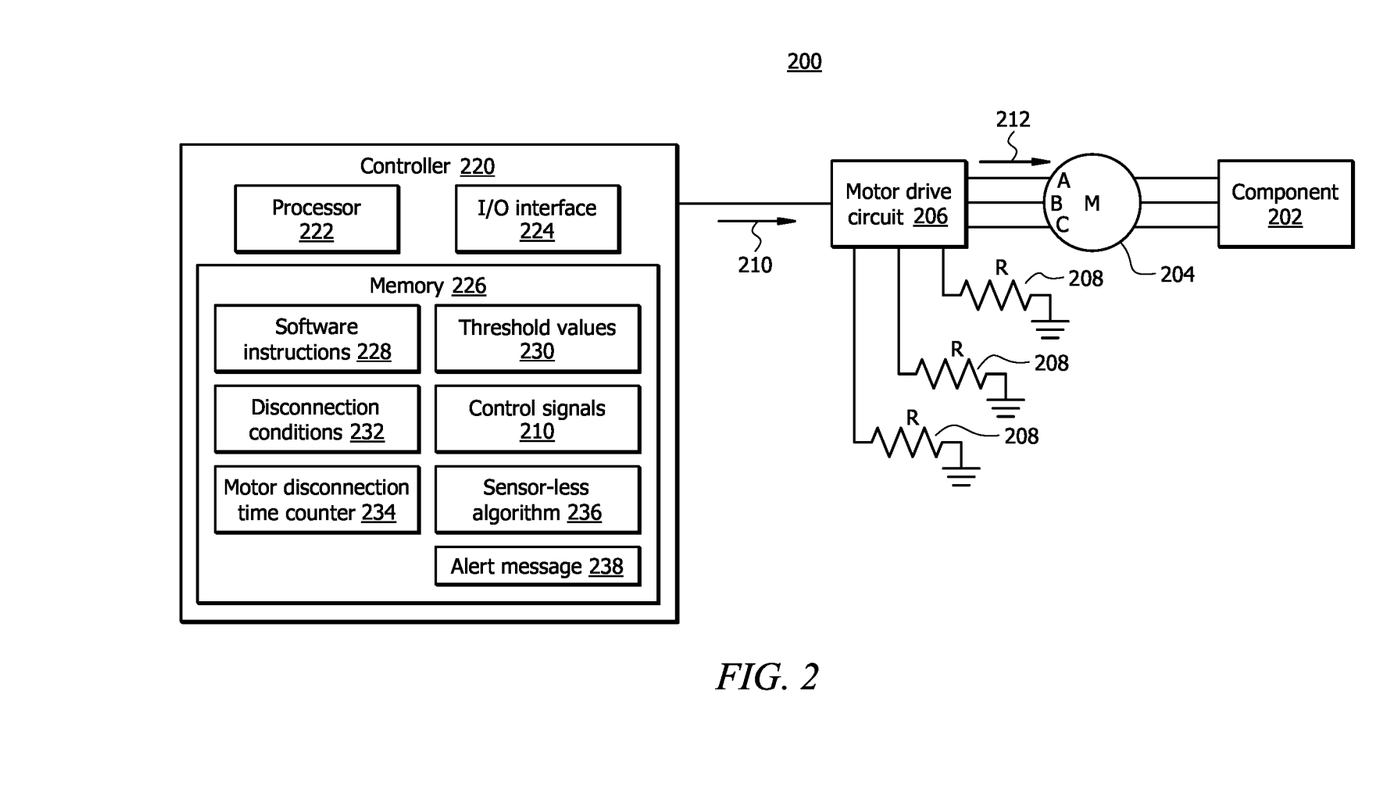

FIG. 2 illustrates an example embodiment of a motor disconnection detection system 200. The system 200 includes a motor-driven component 202, a motor 204, a motor drive circuit 206, and a controller 220. The motor-driven component 202 may be any of the components of the HVAC system 100, including the compressor 106, fan 110, or blower 128 of FIG. 1. In other embodiments, the system 200 may include fewer components or additional components than those described above.

System 200 is generally configured to detect a disconnection with respect to one or more terminals of the motor 204. In some cases, a terminal (e.g., any of the terminals a, b, c) of the motor 204 may be disconnected due to hardware and/or software malfunctions. If the motor 204 is disconnected from the motor drive circuit 206 or the component 202, the current approaches do not provide a solution to detect motor disconnection. In other words, using the current approaches, it is not known whether the motor is disconnected, much less whether the location of the disconnection is from a motor terminal or from a side of the motor 204—from the front or the backend.

System 200 is configured to provide a technical solution to the technical problem above and other technical problems. For example, the system 200 is configured to provide a method to detect the disconnection at one or more terminals of the motor 204. The system 200 is configured to detect the motor disconnection while the motor 204 is switched off (e.g., before its operation starts). This operation is described in greater detail in FIGS. 2-5. The system 200 is further configured to detect the motor disconnection while the motor 204 is switched on. This operation is described in greater detail in FIGS. 2 and 6.

System Components

Example Motor

Motor 204 is generally any appropriate motor configured to operate component 202. For example, motor 204 may be a motor of a compressor (e.g., compressor 106 of FIG. 1), a fan (e.g., fan 110 of FIG. 1), or a blower (e.g., blower 128 of FIG. 1). The motor 204 may be any electrically powered motor that is powered by a motor-drive signal 212. For example, the motor 204 may be an induction motor. Motor-drive signal 212 may be a pulse-width modulated signal, a DC voltage signal, and the like. Motor drive circuit 206 is generally any appropriate circuit for providing the motor-drive signal 212 in order to drive the motor 204. For instance, the motor drive circuit 206 may be a direct current-alternating current (DC-AC) inverter circuit.

Motor 204 may be configured to operate the component 202. For example, the motor 204 may be configured to power the component 202 by communicating signals. The motor drive circuit 206 may receive control signals 210 from the controller 220 and send a motor drive signal 212 to the motor 204. As described above, the motor-driven component 202 may be any of the compressor 106, the fan 110, or the blower 128 of the HVAC system 100, described above. While the example of FIG. 2 is generally described in the context of operating along with or within an HVAC system, such as HVAC system 100, it should be understood that system 200 may be used in any other appropriate context involving a motor-driven component 202 and is not limited to a motor-driven component 202 of an HVAC system.

Example Motor Drive Circuit

Figure 3:
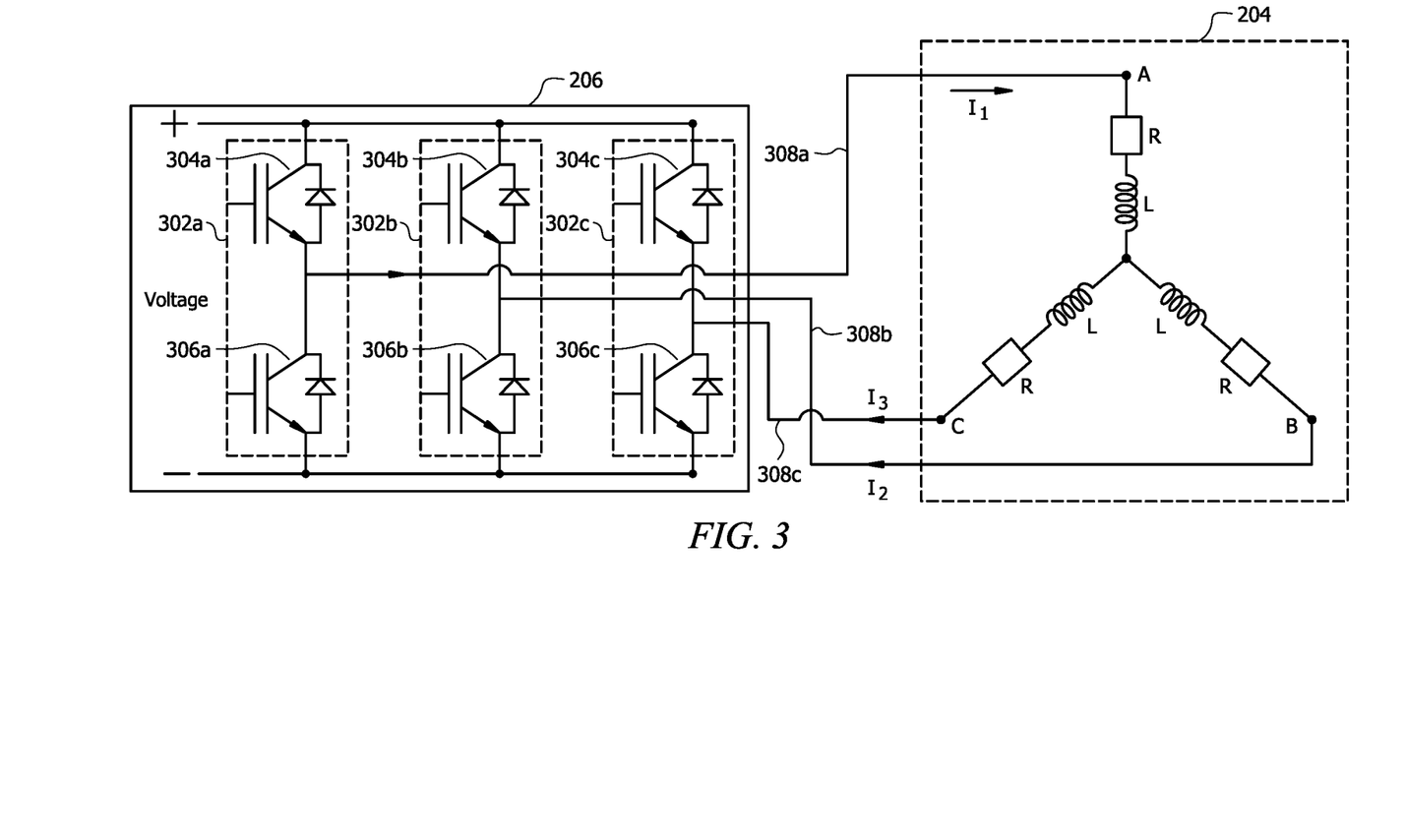
FIG. 3 is a diagram of an example motor drive circuit for use in the system of FIG. 2.

Motor drive circuit 206 is described in greater detail in FIG. 3. In brief, the motor drive circuit 206 is generally any circuit that is configured to power the motor 204. The motor drive circuit 206 may be include complementary transistors stages configured to drive DC signals to terminals of the motor 204 in response to being switched on or off according to the PWM control signals 210. The motor drive circuit 206 may further include or be operably coupled to shunt resistors 208. The shut resistors 208 may act as current sensors configured to detect current received from different terminals of the motor 204. The motor drive circuit 206 may be a pulse-width modulated power circuit where the modulated pulse signals 210 are communicated from the controller 220.

Example Controller

Controller 220 may be the controller 138 of FIG. 1. The controller 220 may include a processor 222, a memory 226, and an input/output (I/O) interface 224. The memory 226 stores software instructions 228 that when executed by the processor 222 cause the processor 222 to perform one or more operations of the controller 220 described herein. In some embodiments, the controller 220 may include fewer components or additional components than those described above.

The processor 222 includes one or more processors operably coupled to the memory 226. The processor 222 is any electronic circuitry including, but not limited to, state machines, one or more central processing unit (CPU) chips, logic units, cores (e.g. a multi-core processor), field-programmable gate array (FPGAs), application specific integrated circuits (ASICs), or digital signal processors (DSPs) that communicatively couples to memory 226 and controls the operation of HVAC system 100 (see FIG. 1). The processor 222 may be a programmable logic device, a microcontroller, a microprocessor, or any suitable combination of the preceding. The processor 222 is communicatively coupled to and in signal communication with the memory 226. The one or more processors are configured to process data and may be implemented in hardware or software. For example, the processor 222 may be 8-bit, 16-bit, 32-bit, 64-bit or of any other suitable architecture. The processor 222 may include an arithmetic logic unit (ALU) for performing arithmetic and logic operations, processor registers that supply operands to the ALU and store the results of ALU operations, and a control unit that fetches instructions from memory 226 and executes them by directing the coordinated operations of the ALU, registers, and other components. The processor may include other hardware and software that operates to process information, control the HVAC system 100 (see FIG. 1), and perform any of the functions described herein (e.g., with respect to FIGS. 1-6). The processor 222 is not limited to a single processing device and may encompass multiple processing devices. Similarly, each of the controllers 220 is not limited to a single controller but may encompass multiple controllers.

The memory 226 includes one or more disks, tape drives, or solid-state drives, and may be used as an over-flow data storage device, to store programs when such programs are selected for execution, and to store instructions and data that are read during program execution. The memory 226 may be volatile or non-volatile and may include read only memory (ROM), random access memory (RAM), ternary content-addressable memory (TCAM), dynamic random-access memory (DRAM), and static random-access memory (SRAM). The memory 226 is operable to store software instructions 228 that when executed by the processor 222 cause the processor 222 to perform one or more operations of the controller 220 described herein. The memory 226 may further store control signals 210, threshold values 230, disconnection conditions 232, and motor disconnection time counter 234, sensor-less algorithm 236, alert message 238, and/or any data/instruction described in conjunction with FIGS. 1-6.

The control signals 210 may include signals configured to instruct the motor drive circuit 206 to transmit motor drive signals 212 to the motor 204. For example, the control signals 210 may include instructions in form of signals, modulated signals, pulse-width modulation signals, and the like.

In one example, the control signals 210 may include signals to activate (e.g., turn on) one or more transistors in the motor drive circuit 206 and deactivate (e.g., turn off) one or more transistors in the motor circuit 206 so that a DC voltage signal is sent from the motor drive circuit 206 to a first terminal of the motor 204 and a returning DC voltage signal is received from second and third terminals of the motor 204. This operation is described in greater detail in FIG. 3.

The threshold values 230 may include any of the thresholds used to implement the functions described herein including thresholds associated with detecting a motor disconnection at one or more terminals. For example, the threshold values 230 may include a first current threshold associated with a first terminal of the motor 204, a second current threshold associated with a second terminal of the motor 204, and a third current threshold associated with a third terminal of the motor 204. In some examples, the threshold values 230 may include voltage thresholds associated with the motor 204 and/or component 202, speed thresholds associated with the motor 204 and/or component 202, and torque thresholds associated with any of the motor 204, component 202, a rotor (associated with the motor 204), a stator (associated with the motor 204), inverters (e.g., complementary stages associated with the motor 204 shown in FIG. 3), and/or other components of the motor 204, component 202 and/or the HVAC system 100 of FIG. 1. Threshold values 230 may include thresholds associated with operation of the HVAC system 100 that indicate a motor disconnection at one or more terminals of the motor 204. For example, threshold values may correspond to a threshold value or range of values associated with the speed or torque of motor 204 and/or the component 202.

The sensor-less algorithm 236 may be implemented by the processor 222 executing software instructions 228 and is generally configured to exert control signals to the circuit model of the motor 204 to estimate the modeled behavior of the motor 204. The controller 220 may maintain a circuit model of the motor 204, e.g., in software code or instructions 228. The circuit model of the motor 204 may represent a real-time simulation of the motor 204. The controller 220 may exert control signals to the circuit model of the motor 204 to estimate the modeled behavior of the motor 204. This method may be referred to as a sensor-less algorithm 236 which observes motor parameters based on the circuit model of the motor 204. For example, the sensor-less algorithm 236 may determine or estimate the current and voltage at each phase of the motor, flux, torque, speed, and angle of the rotor, among other parameters. In this manner, the controller 220 may implement the software code 228 (that includes the sensor-less algorithm 236) to estimate the modeled speed associated with the motor 204. In certain embodiments, the controller 220 may implement the software code 228 (that includes the sensor-less algorithm 236) to estimate the modeled speed associated with the motor 204.

The I/O interface 224 is configured to communicate data and signals with other devices. For example, the I/O interface 224 may be configured to communicate electrical signals with components of the HVAC system 100 and system 200 including the compressor 106, the fan 110, the expansion valve 114, the blower 128, sensors 132a-d, the thermostat 134, and the motor drive circuit 206. The I/O interface may receive, for example, thermostat calls, temperature setpoints, environmental conditions, sensor data, and an operating mode status for the HVAC system 100 and send electrical signals to the components of the HVAC system 100. The I/O interface 224 may include ports or terminals for establishing signal communications between the controllers 220 and other devices. The I/O interface 224 may be configured to enable wired and/or wireless communications.

One or more of the components of the controllers 220 described above may also or alternatively be included in the motor drive circuit 206 of FIG. 2. For example, the motor drive circuit 206 may include instances of the processor 222, memory 226, and/or I/O interface 224. For example, if processor 222 is included in the motor drive circuit 206 of FIG. 2, the processor 222 of the motor drive circuit 206 may be configured to determine whether there is a disconnection at one or more terminals of the motor 204, as described in greater detail below. If the memory 226 is included in the motor drive circuit 206 of FIG. 2, this memory 226 of the motor drive circuit 206 may store threshold values 230 (e.g., associated with whether there is a disconnection at one or more terminals of the motor 204) among other data/instructions described herein.

The motor drive circuit 206 may be connected to shunt resistors 208. The shunt resistors 208 may act as current sensors for sensing current at the terminals of the motor 204 and/or current at inverters within the motor drive circuit 206. In one example, the shunt resistors 208 may be current sensors (e.g., 132c, d) described in FIG. 1. The motor drive circuit 206 may be connected to voltage sensors (e.g., 132c, d) that are configured to sense voltage at the terminals of the motor 204, similar to that described in FIG. 1.

Operational Flow for Motor Disconnection while the Motor is Switched Off

In operation, to determine the motor disconnection while the motor 204 is switched off, in certain embodiments, the controller 220 may first determine whether the motor is powered up. To this end, the control 220 may determine whether the PWM signal 210 (e.g., PWM signal shown in FIG. 4) is enabled. In normal operational conditions, the controller 220 may execute the software instructions 228 to communicate the control signals 210 (e.g. PWM signals) to the motor drive circuit 206. In some cases, if there is a software or hardware malfunction at any of the components of the HVAC system 100 of FIG. 1 or any of the components of the system 200, the controller 220 may disable the control signals 210 (e.g., not communicate the control signals 210 to the motor drive circuit 206). In some cases, if an anomaly is detected with respect to any of the components 202, the controller 220 may disable the communication of the control signals 210 to the motor drive circuit 206. For example, if the controller 220 detects that a temperature of a component 202 is more than a threshold temperature (e.g., a threshold temperature value 230), the controller 220 may disable the control signals 210 (e.g., communication of the control signals 210 may be disabled). In another example, if the controller 220 detects an unstable power supply (or any other anomaly), the communication of the control signals 210 may be disabled. In some examples the motor drive circuit 206 may disable the communication of the motor drive signals 212 to the motor 204 if the motor drive circuit 206 detects a software malfunction, a hardware malfunction, and/or an anomaly with respect to a component 202 or the motor 204. By determining whether the PWM signal 210 is enabled, the controller 220 may exclude other cases that may lead to the current not flowing through the terminals of the motor 204. In other words, in this way, false positive determinations of motor disconnections (with respect to disconnection at a motor terminal) are reduced or eliminated.

Determining Whether the Alignment Procedure is being Performed

In certain embodiments, the controller 220 may determine whether the motor 204 is in the alignment procedure. Before the alignment procedure, the position of the permanent magnet within the motor 204 is not known. However, the position of the windings within the motor 204 is known. Therefore, to align the permanent magnets to one of the windings, a DC voltage is injected (e.g., communicated) to a terminal (e.g., a phase) of the motor 204. In response, current flows through the winding associated with the terminals, and an electromagnet field is established along the phases of the motor 204. In response, the permanent magnet will position itself to be aligned with the established electromagnet field induced along the phase of the motor 204.

In certain embodiments, before starting field magnet control with respect to permanent magnets (not shown) within the motor 204, it is desired to align the permanent magnets with at least one of the windings within the motor 204. When the permanent magnet is aligned with at least one of the windings, that position may be taken as the reference position of the rotor angle being zero. From that point on, the angle of the rotor may be calculated with respect to the reference position. In this manner, the angle of the rotor may be calculated while the rotor is rotating.

To initiate the alignment procedure, the controller 220 may communicate, to the motor drive circuit 206, an alignment control signal that indicates to inject a DC signal to the motor 204. The alignment control signal may be included in the control signals 210. In response, the motor drive circuit 206 may communicate the motor drive signals 212 that includes DC signals to the phases a, b, and c of the motor 204 to induce the current through the phases and align the rotor angle with a known angle. The aligned rotor angle is used for motor control purposes.

The motor drive circuit 206 may inject the DC signals when triggered by the software control instructions 228 from the controller 220. The software control instructions 228 may control the PWM control signals 210 which then triggers the motor drive circuit 206 to inject the DC signals to phases a, b, and c of the motor 204. The amplitudes of DC signals are controlled by the software control instructions 228. In one example, the same amplitude DC voltage signal may be applied to the phases a, b, and c. The control signals 210 may be used to perform the alignment procedure described above.

Detecting Motor Disconnection Based on Evaluating the Current at Each Terminal

Referring to FIG. 2, while the alignment procedure is being performed, the controller 220 may evaluate the current signal values with respect to a respective expected current value at each terminal (e.g., each of the terminals a, b, and c) of the motor 204. For example, the controller 220 may communicate the control signal 210 that indicates to transmit a DC voltage signal to one or more terminals of the motor 204 in response to determining that the permanent magnet associated with the motor 204 is being aligned with a winding of the motor 204. In response, the controller 220 may determine the current signal values at the terminals of the motor 204.

The controller 220 may compare each of the determined current signals with a respective threshold current value (e.g., threshold current value 230). Each respective threshold current value may be related to an expected current value at a respective terminal. For example, if a first expected current value at a first terminal is 4 milli-ampere (mA), the first threshold current value may be the 4 mA or within a range of 4 mA. In another example, if a second expected current value at a second terminal is 2 mA, the second threshold current value may be 2 mA or within a range of 2 mA. The expected current values may be based on current values determined during normal conditions where there is no disconnection at a terminal of the motor 204.

If the controller 220 determines that a first determine current value (determined at a first terminal a) is less than a respective current value, it may be determined that the first terminal a of the motor is disconnected, e.g., from the motor drive circuit 206. Otherwise, it may be determined that the first terminal a is connected to the motor drive circuit 206. The controller 220 may perform similar operations for other current values at other terminals. For example, the controller 220 may determine a second current value at a second terminal b of the motor 204. The controller 220 may then compare the second current value with a second threshold current value. The second current value may be different from one or more other current values. The controller 220 may determine whether the second current value is more than the second threshold current value. If it is determined that the second current value is more than the second threshold current value, the controller 220 may determine that the second terminal b of the motor 204 is disconnected, e.g., from motor drive circuit 206. Otherwise, it may be determined that the second terminal is connected to the motor drive circuit 206. Similar operations may be performed for terminal c of the motor 204.

Figure 4:
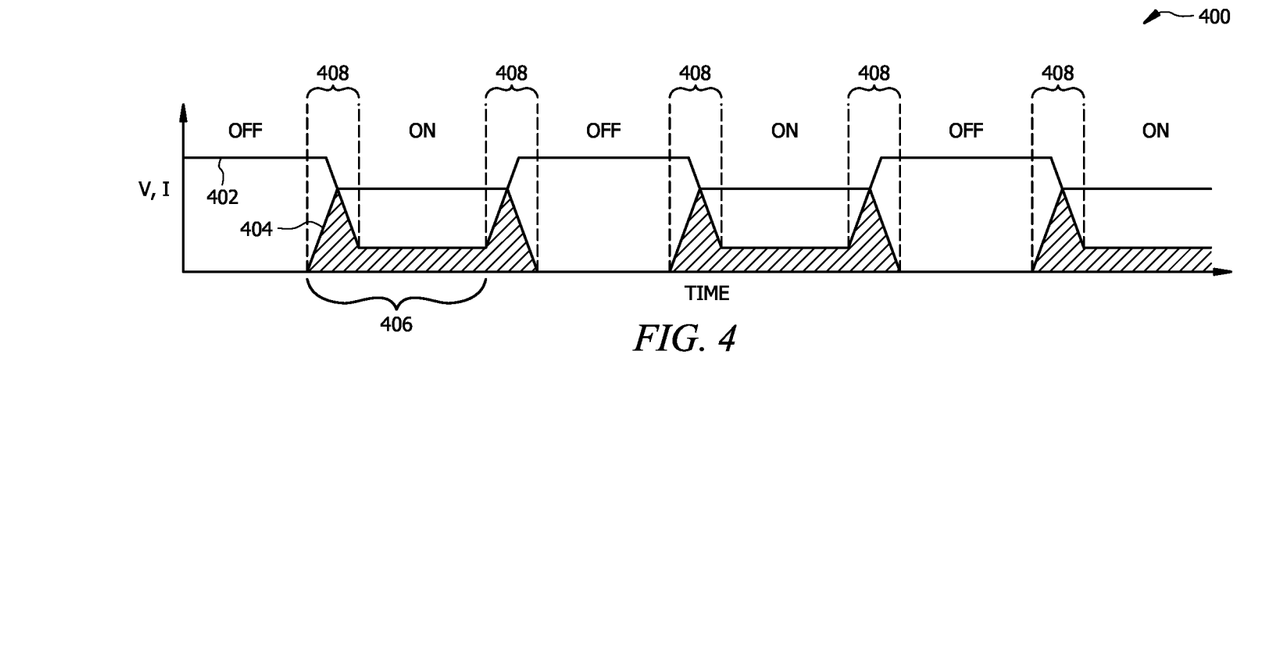
FIG. 4 illustrates a plot of an example motor-drive signal provided by a transistor-pair stage of the example motor drive circuit of FIG. 3.

FIG. 3 illustrates a circuit diagram of an example of the motor drive circuit 206 of FIG. 2. As shown in FIG. 3, motor drive circuit 206 may include three stages 302a-c, where each stage 302a-c includes a corresponding pair of transistors (transistors 304a-c and 306a-c). Each stage 302a0c may be referred to as an inverter. For example, the first stage 302a has a first transistor 304a and a second transistor 306a. Similarly, stages 302b and 302c have corresponding first transistors 304b and 304b, respectively, and second transistors 306b and 306c, respectively. Signal(s) and/or commands (e.g., control signal(s) 210) received from the controller 220 (see FIG. 2) provides instructions for the operation of each stage 302a-c. For example, the controller 220 may provide signal(s) 210 and/or command(s) associated with the frequency at which transistors 304a-c and 306a-care switched on and off (e.g., to provide an appropriately modulated signal for powering the motor 204). Each stage 302a-c has a corresponding signal output 308a-c. The motor-drive signal 212 of FIG. 2 may include signals from each of the outputs 308a-c. An example of signals 308a-c is shown in FIG. 4.

In FIG. 3, some of the internal components of three phases of the motor 204 are illustrated. Each phase of the motor 204 may include a resistor (R) and an inductor (L). The RL model of a phase may be used to determine the current and voltage at each phase when the motor is switched off. When the motor 204 is switched on, other components may be included in modeling each phase, such as a voltage source. In certain embodiments, the motor 204 may include some, all, or additional components with respect to those shown in FIG. 3. The RL circuit model is used for illustration purposes and is not meant to limit the scope of the present disclosure.

During operation of the motor drive circuit 206, when a first transistor 304a-c of a given stage 302a-c is switched on, a second transistor 306a-c is switched off (and vice versa). For example, if, at a given time during operation of stage 302a, transistor 304a is in an "on state" (e.g. corresponding to a state in which current can flow through transistor 304a), the associated second transistor 306a is in an off state (e.g. corresponding to a state in which current cannot flow through transistor 306a).

In an example operation of system 200, the controller 220 provides (e.g., transmits) a control signal 210 to the motor drive circuit 206. The control signal 210 causes stages 302a-c to operate such that a switching frequency of each stage (i.e., the frequency at which each of signals 308a-c switch between an on and off state, which is associated with the frequency at which transistors 304a-c and 306a-c are switched on and off). For example, the control signal 210 may indicate to transmit a DC voltage signal to the phase or terminal a of the motor 204. In this example, the transistors 304a, 306b, and 306c are switched on and other transistors are switched off. This leads to the current ($I_1$) flowing from the transistor 304a to the terminal a. The current $I_1$ is divided and flows to terminals b and c. The current $I_1$ is divided depending on the equivalent impedance along each phase/ leg b and c. For example, if phases b and c have an equal impedance compared to each other, the current $I_1$ is divided into two equal parts, $I_1/2$ flows to terminal b and $I_1/2$ flows to terminal c. The current $I_2$ flows out of terminal b, and current $I_3$ flows out of terminal c. The current $I_2$ flows through the switched-on transistor 306b, and current $I_3$ flows through the switched-on transistor 306c. The currents $I_{2,3}$ are flown back to the motor drive circuit 206 and the controller 220.

The controller 220 may measure the currents $I_{1,2,3}$, and compares each of them to a respective threshold current level to determine whether a current $I_{1,2,3}$ is less than a respective threshold current level, similar to that described in FIG. 2. If it is determined that any of the currents $I_{1,2,3}$ is less than a respective threshold current, it may be determined that a respective terminal is disconnected.

Operational Flow for Motor Disconnection while the Motor is Switched on

Referring back to FIG. 2, the system 200 may further be configured to detect motor disconnection while the motor 204 is switched on (i.e., running). When the motor 204 is switched on, certain motor parameters are not constant and vary depending on the operation of the motor 204, the current applied to the motor 204, among other factors. For example, when the motor 204 is switched on, the circuit model of the motor 204 may include a voltage source that varies as a function of the current applied to the motor 204, the inductance of the motor 204 may vary as a function of the current applied to the motor 204, among others. Thus, in situations where the motor 204 is switched on, relying on static RL model may not be reliable. Furthermore, in such situations, a DC voltage signal may not be reliable for motor disconnection detection. Therefore, the operational flow of system 200 for motor disconnection while the motor 204 is switched on may rely on various factors, such as, the control signals 210 (e.g., PWM signals) are enabled, a modeled speed of the motor 204, the drive voltage output (e.g., motor drive signal 212) that is provided to the motor 204 from inverter stages within the motor drive circuit 206, the current applied to the motor 204, and estimated impedance associated with the motor 204 that is determined from the drive voltage output and the current applied to the motor 204. These factors may be referred to as a set of motor disconnection conditions 232. The following description describes how the system 200 determines whether each of the set of motor disconnection conditions 232 is evaluated to detect motor disconnection while the motor 204 is switched on.

Determining Whether a Set of Motor Disconnection Conditions is Met

In operation, the operational flow of the system 200 for motor disconnection while the motor 204 is switched on may begin when the controller 220 evaluates each of the set of motor disconnection conditions 232. The controller 220 may determine whether the control signals 210 are enabled, similar to that described above with respect to the operational flow of the system 200 for motor disconnection while the motor 204 is switched off. In normal operational condition, the controller 220 may execute the software instructions 228 to communicate the control signals 210 to the motor drive circuit 206. In response, the motor drive circuit 206 may generate and communicate the motor drive signals 212 to the motor 204. However, if there is a software malfunction, a hardware malfunction, and/or an anomaly detected with respect to any of the components of the systems 100, 200, the control signals 210 may be disabled (e.g., not communicated to the motor drive circuit 206). Thus, in this manner, the controller 220 may determine whether the motor 204 is receiving signals by determining whether the control signals 210 are enabled.

The controller 220 may maintain a circuit model of the motor 204, e.g., in software code or instructions 228. The controller 220 may use the sensor-less algorithm 236 to estimate the modeled speed associated with the motor 204. The controller 220 may determine whether the modeled speed (associated with the motor 204 is more than a threshold speed, e.g., in response to determining that the control signals 210 are enabled. The modeled speed associated with the motor 204 may be the speed at which the rotor of the motor 204 rotates along its central axis. The threshold speed may be one of the threshold values 230. For example, the threshold speed may be 100 round-per-minute (RPM), 200 RPM, and the like.

The controller 220 may determine whether a drive voltage output associated with the motor drive circuit 206 that is provided to the motor 204 is more than a threshold voltage, e.g., in response to determining that the modeled speed associated with the motor 204 is more than the threshold speed. The drive voltage output may be determined by a voltage sensor (e.g., a sensor 132c, d described in FIG. 1). The drive voltage output may be the motor drive signal 212 that is provided from the inverters stages within the motor drive circuit 206 to the motor 204 as shown in FIG. 3. The same or similar drive voltage output may also be applied to the circuit model of the motor 204. The threshold voltage may be one of the threshold values 230. For example, the threshold voltage may be 110 voltage (v), and the like.

The controller 220 may determine whether the current applied to the motor 204 is less than a threshold current, e.g., in response to determining that the drive voltage output that is provided to the motor 204 is more than the threshold voltage. The current applied to the motor 204 may be determined by a current sensor, such as a shunt resistor 208 (R) which may be an instance of a sensor 132c,d described in FIG. 1. The threshold current may be one of the threshold values 230. For example, the threshold current may be 0.03 A, 0.02 A, and the like.

The circuit model of the motor 204 may not be configured to detect the motor disconnections. For example, in the case of a motor disconnection where little or no current flows through the motor 204, it is practically impossible for the rotor to rotate at a high speed (e.g., the estimated speed more than the threshold speed as described above). However, the circuit model of the motor 204 may indicate that the modeled speed of the rotor is high (e.g., more than the threshold speed). Therefore, this operational flow of the system 200 may be configured to detect motor disconnection scenarios that are not caught by current circuit models of the motor 204.

The controller 220 may determine whether the speed associated with the motor 204 is zero, e.g., in response to determining that the current applied to the motor 204 is less than the threshold current. In some cases, the motor 204 may already be in motion, for example due to manual forces applied to the motor 204, e.g., by an operator. Thus, to exclude such cases from motor disconnection detection, the controller 220 may determine whether the speed associated with the motor 204 is zero. If the speed associated with the motor 204 is not zero, the issues with the motor 204 (if any) may have been influenced by other factors other than solely the operations and connections of the motor 204.

In this manner, the controller 220 may determine whether the set of disconnection conditions 232 is met, where the set of disconnection conditions 232 may include the pulse signal that leads to powering the motor 204 is enabled, the speed associated with the motor 204 is more than the threshold speed, the drive voltage output provided to the motor 204 is more than the threshold voltage, the current applied to the motor 204 is less than the threshold current, and the speed associated with the motor 204 is zero. Although certain embodiments and examples described above indicate evaluating the set of disconnection conditions 232 in a specific order, the controller 220 may evaluate the set of disconnection conditions 232 in any suitable order.

The controller 220 may determine whether the set of disconnection conditions 232 is met for more than a threshold time. The threshold time may be one of the threshold values 230. For example, the threshold values may be ten seconds, twenty seconds, and the like. The evaluation time while the set of disconnection conditions 232 may be evaluated may be tracked by a motor disconnection time counter 234. If the controller 220 determines that the speed associated with the motor 204 is zero, the controller 220 may determine whether the motor disconnection time counter 234 has passed the threshold time. If it is determined that the motor disconnection time counter 234 has passed the threshold time, the controller 220 may determine that the motor 204 is disconnected (at least from one terminal) from the motor drive circuit 206. In other words, if the controller 220 determines that the set of disconnection conditions 232 is met for more than the threshold time, the controller 220 may determine that there is a disconnection at the motor 204. In response, the controller 220 may set the corresponding fault handler flag (e.g., included in the software instructions 228) to true. The controller 220 may also set the motor disconnection time counter 234 to zero. If, however, it is determined that the motor disconnection time counter 234 has not reached the threshold time yet, the controller 220 may increase the motor disconnection time counter 234 by a unit time, e.g., 0.01 second and the like. If the controller 220 determines that the speed associated with the motor 204 is more than zero, the controller 220 may evaluate the motor disconnection time counter 234 and determine whether the motor disconnection time counter 234 is more than zero. For example, if it is determined that the motor disconnection time counter 234 is more than zero, the controller 220 may decrease the motor disconnection time counter 234 by a unit time, e.g., 0.01 second and the like.

In certain embodiments, the controller 220 may determine the impedance (z) associated with the motor 204 by dividing the determine the drive voltage output by the determined current applied to the motor 204. In certain embodiments, it may be determined that the motor is disconnected if the determined impedance associated with the motor 204 is more than a threshold impedance in combination with determining that the estimated speed associated with the rotor (determined by the sensor-less algorithm 236) is more than the threshold speed.

Example PWM Signal

FIG. 4 shows an example of a voltage signal 402 and current signal 404 provided by one of the stages 302a-c of the motor drive circuit 206 (e.g., as signals 308a-c of FIG. 3). The voltage signal 402 and current signal 404 of FIG. 4 are at an initial switching frequency associated with the normal operation of the component (e.g., motor-driven component 202 of FIG. 2). During the "off" times shown in FIG. 4, the voltage signal 402 is relatively large and the current signal 404 is negligible or zero. During the "on" times shown in FIG. 4, the voltage signal 402 is at a relatively small but non-zero value and the current signal 404 is relatively large.

The switching frequency for a signal 308a-c of a given stage 302a-c corresponds to the rate at which the corresponding transistors 304a-c and 306a-c are switched on and off (e.g., the number of times the current signal 404 switches between on and off states per unit of time). The switching frequency is inversely proportional to the period 406 shown in FIG. 4. For example, the initial switching frequency during operation of system 200 maybe 16 kHz. A transition period 408 occurs between the off and on times. Power losses, which are proportional to the current signal 404 multiplied by the voltage signal 402, are illustrated by the shaded regions in FIG. 4. Power losses during the "on" periods are referred to as conduction losses. Power losses during each switching transition period 408 are referred to as switching losses.

Figure 5:
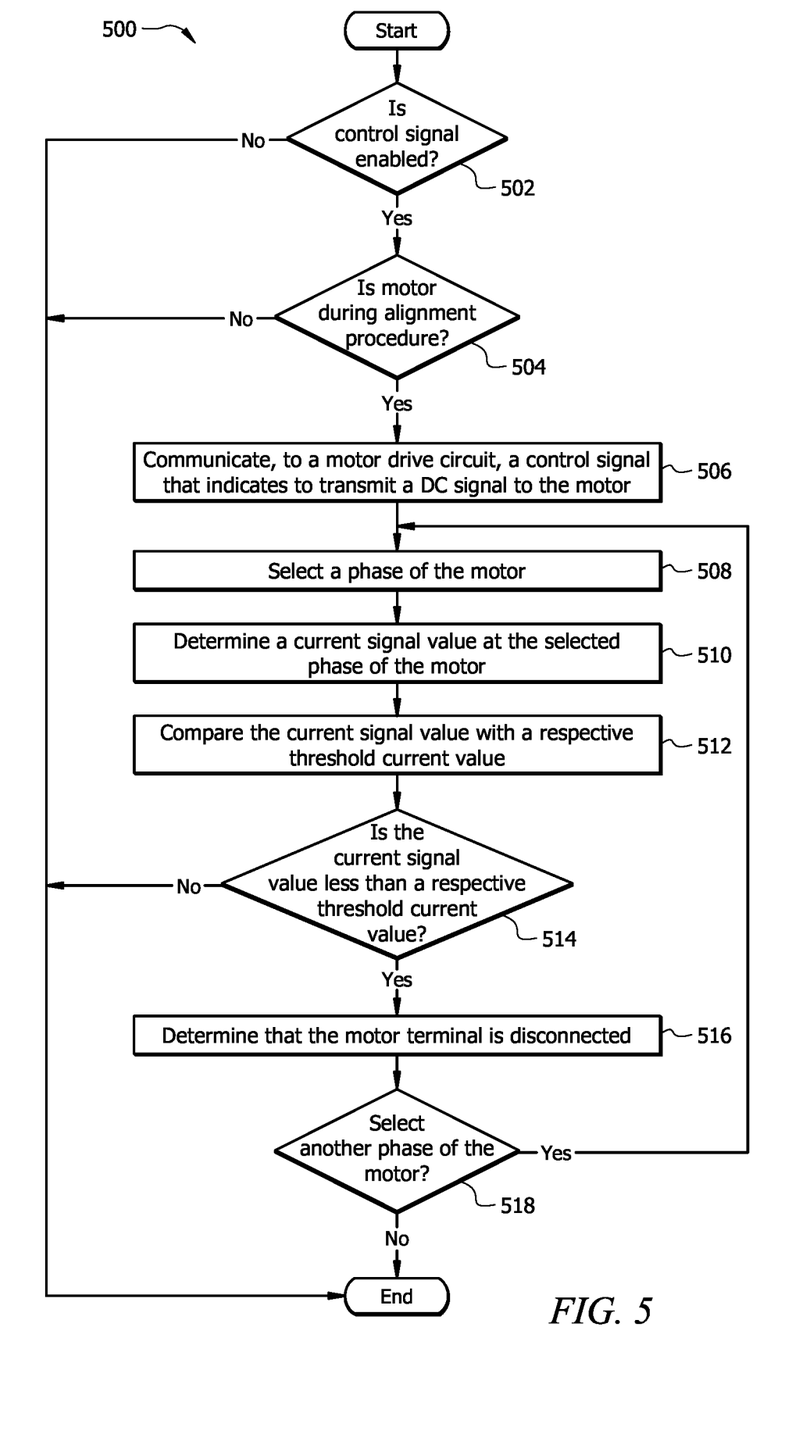
FIG. 5 illustrates a flowchart of an example method for detecting motor disconnections when the motor is switched off.

Example Method for Detecting Motor Disconnection while the Motor is Switched Off FIG. 5 illustrates an example method 500 of system 200 of FIG. 2 for detecting motor disconnection while the motor 204 is switched off. Modifications, additions, or omissions may be made to method 500. Method 500 may include more, fewer, or other operations. For example, operations may be performed in parallel or in any suitable order. While at times discussed as the system 100, system 200, the controller 220, or components of any of thereof performing operations, any suitable system or components of the system may perform one or more operations of the method 500. For example, one or more operations of method 500 may be implemented, at least in part, in the form of software instructions 228 of FIG. 2, stored on tangible non-transitory computer-readable media (e.g., memory 226 of FIG. 2) that when run by one or more processors (e.g., processor 222 of FIG. 2) may cause the one or more processors to perform operations 502-518.

At operation 502, the controller 220 determines whether the control signal 210 is enabled. The control signal 210 may include PWM signals (see FIG. 4), pulse control signals, and the like. The control signal 210 may be used to control the motor drive circuit 206, similar to that described in FIGS. 2 and 3. If it is determined that the control signal 210 is enabled, method 500 proceeds to operation 504. Otherwise, method 500 may end.

At operation 504, the controller 220 determines whether the motor 204 is in the alignment procedure, according to certain embodiments described herein. In this process, the controller 220 may determine whether the permanent magnet associated with the motor 204 is being aligned with a winding associated with the motor 204, similar to that described in FIG. 2. The control signal 210 may cause the motor drive circuit 206 to inject DC signals to the terminals of the motor 204. The DC signals may induce current along the phases of the motor 204 which leads to aligning the permanent magnet of the motor 204 with the phase of the motor 204, similar to that described in FIG. 2. If it is determined that the motor 204 is in alignment procedure, method 500 proceeds to operation 506. Otherwise, method 500 may end.

At operation 506, the controller 220 communicates, to a motor drive circuit 206, a control signal 210 that indicates to transmit a DC signal to the motor 204. For example, the control signal 210 may be the control signal that is used for the alignment procedure or an additional control signal.

At operation 508, the controller 220 selects a phase of the motor 204. The phase of the motor 204 may also be referred to as a terminal or a leg of the motor 204. The controller 220 may iteratively select a phase of the motor 204 until all the phases of the motor 204 are evaluated. In case, the motor 204 is a three-phase motor, each of the three phases of the motor is iteratively selected.

At operation 510, the controller 220 determine a current signal value at the selected phase/terminal/leg of the motor 204. For example, the controller 220 may determine the $I_1$ if the phase a is selected, $I_2$ if the phase b is selected, and $I_3$ if the phase c is selected. The controller 220 may determine the current signal value by using a current sensor, a shunt resistor 208, and the like, similar to that described in FIG. 2.

At operation 512, the controller 220 compares the determined current signal value with a respective threshold current value. The respective threshold current value may be different from other threshold current values, similar to that described in FIGS. 2 and 3. The respective threshold current value may be one of the threshold values 230.

At operation 514, the controller 220 determines whether the current signal value is less than the respective threshold current value. If it is determined that the current signal value is less than the respective threshold current value, method 500 may proceed to operation 516. Otherwise, method 500 may end.

At operation 516, the controller 220 determines that the motor terminal where the current signal value is determined to be less than the threshold current value is disconnected. For example, the controller 220 may determine that the motor terminal is disconnected from the motor drive circuit 206. In another example, the controller 220 may determine that the motor terminal is disconnected from the component 202. In response to detecting the motor disconnection, the controller 220 may communicate an alert message 238 that indicates that the particular terminal of the motor is disconnected from the motor drive circuit 206. For example, the controller 220 may communicate the alert message 238 to a computing device associated with an operator and/or display the alert message 238 on a display screen associated with the controller 220. In certain embodiments, the controller 220 may determine that the motor terminal is disconnected, if the determined current signal value is determined to be less than the threshold current value for more than a threshold time window (e.g., more than ten seconds, twenty seconds, etc.), for example, while the control signal 210 is enabled and the alignment procedure is taking place.

At operation 518, the controller 220 may determine whether to select another phase of the motor 204. The controller 220 may determine to select another phase of the motor 204 if at least one phase is left for evaluation. If it is determined that at least one phase is left for evaluation, method 500 may return to operation 508. Otherwise, method 500 may end. The controller 220 may perform the method 500 periodically, for example, every 0.01 seconds, 0.02 seconds, and the like. In certain embodiments, the motor drive circuit 206 may transmit the DC signal to at least one of the three terminals of the motor 204 in response to receiving the control signal 210 from the controller 220. For example, the motor drive circuit 206 may transmit the DC voltage signal to the terminal a, similar to that described in FIG. 3.

In certain embodiments, the motor drive circuit 206 may transmit the DC voltage signal to the first terminal (e.g., terminal a) of the motor 204 when a first transistor 304a is switched on and the second transistor 306a is switched off, similar to that described in FIG. 3. In such embodiments, the motor drive circuit 206 may receive a second DC voltage signal from a second terminal (e.g., terminal b) of the motor 204 when a third transistor 306b is switched on and a fourth transistor 304b is switched off. Similarly, the motor drive circuit 206 may receive a third DC voltage signal from a third terminal (e.g., terminal c) of the motor 204 when a fifth transistor 306c is switched on and a sixth transistor 304b is switched off.

Example Method for Detecting Motor Disconnection while the Motor is Switched on

Figure 6:
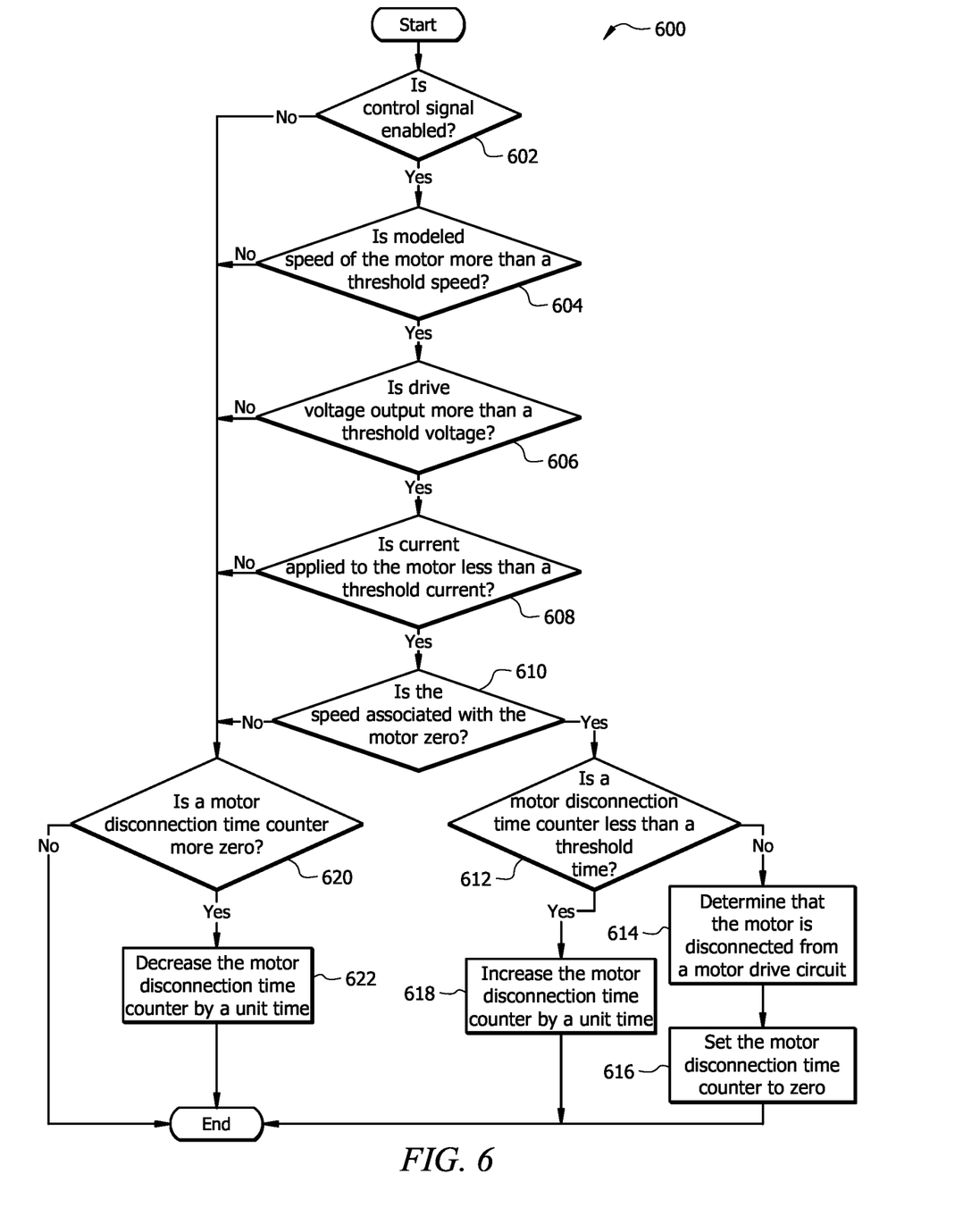

FIG. 6 illustrates an example method 600 of system 200 of FIG. 2 for detecting motor disconnection while the motor 204 is switched on. Modifications, additions, or omissions may be made to method 600. Method 600 may include more, fewer, or other operations. For example, operations may be performed in parallel or in any suitable order. While at times discussed as the system 100, system 200, the controller 220, or components of any of thereof performing operations, any suitable system or components of the system may perform one or more operations of the method 600. For example, one or more operations of method 600 may be implemented, at least in part, in the form of software instructions 228 of FIG. 2, stored on non-transitory, tangible, machine-readable media (e.g., memory 226 of FIG. 2) that when run by one or more processors (e.g., processor 222 of FIG. 2) may cause the one or more processors to perform operations 602-622.

At operation 602, the controller 220 determines whether the control signal 210 is enabled. For example, the controller 220 may determine that the control signal 210 is enabled if there is no anomaly, hardware malfunction, software malfunction, or the like detected, similar to that described in FIG. 2. If it is determined that the control signal 210 is enabled, method 600 may proceed to operation 604. Otherwise, method 600 may proceed to operation 620.

At operation 604, the controller 220 determines whether the modeled speed associated with the motor 204 is more than the threshold speed. The controller 220 may determine the modeled speed of the rotor associated with the motor 204 and compare it to the threshold speed, similar to that described in FIG. 2. If it is determined that the modeled speed associated with the motor 204 is more than the threshold speed, method 600 may proceed to operation 606. Otherwise, the method 600 may proceed to operation 620.

At operation 606, the controller 220 determines whether the drive voltage output is more than the threshold voltage. For example, the controller 220 may determine the drive voltage output by a voltage sensor at the motor 204 and compare it to the threshold voltage, similar to that described in FIG. 2. If it is determined that the drive voltage output is more than the threshold voltage, method 600 may proceed to operation 608. Otherwise, method 600 may proceed to operation 620.

At operation 608, the controller 220 determines whether the current applied to the motor 204 is less than a threshold current. For example, the controller 220 may determine the current applied to the motor 204 by a shunt resistor 208 and compare it to the threshold current, similar to that described in FIG. 2. If it is determined that the applied current is less than the threshold current, method 600 proceeds to operation 610. Otherwise, method 600 proceeds to operation 620.

At operation 610, the controller 220 determines whether the speed associated with the motor 204 is zero. If it is determined that the speed associated with the motor 204 is more than zero, it may mean that the motor 204 is rotating by external or manual forces, for example, by an operator. In such cases, controller 220 may apply an opposite force to bring the motor 204 to a stop position. If it is determined that the speed associated with the motor 204 is zero, the method 600 may proceed to operation 612. Otherwise, method 600 may proceed to operation 620. The operations 602 to 610 may correspond to operations where the disconnection conditions 232 are evaluated.

At operation 612, the controller 220 determines whether the motor disconnection time counter 234 has reached the threshold time. In other words, the controller 220 determines whether the set of motor disconnection conditions 232 is met for more than the threshold time. If it is determined that the motor disconnection time counter 234 has reached the threshold time, the method 600 proceeds to operation 614. Otherwise, the method 600 may proceed to operation 618.

At operation 614, the controller 220 determines that the motor 204 is disconnected from the motor drive circuit 206. The controller 220 may also determine a particular motor terminal (e.g., terminal a, b, c) that is disconnected. In response to detecting the motor disconnection, the controller 220 may communicate an alert message 238 that indicates at least one of the terminals of the motor is disconnected from the motor drive circuit 206. For example, the controller 220 may communicate the alert message 238 to a computing device associated with an operator and/or display the alert message 238 on a display screen associated with the controller 220.

At operation 616, the controller 220 sets the motor disconnection time counter 234 to zero. At operation 618, the controller 220 increases the motor disconnection time counter 234 by a unit time, similar to that described in FIG. 2.

At operation 620, the controller 220 determines whether the motor disconnection time counter 234 is more than zero. If it is determined that the motor disconnection time counter 234 is more than zero, method 600 proceeds to operation 622. Otherwise, method 600 ends.

At operation 622, the controller 220 decreases the motor disconnection time counter 234 by a unit time, similar to that described in FIG. 2. In certain embodiments, the method 600 may be performed periodically, for example, every 0.1 seconds, 0.2 seconds, and the like.

In certain embodiments, the motor disconnection time counter 234 may be triggered and started when the controller 220 initiates evaluating the set of disconnection conditions 232. In certain embodiments, determining that the motor 204 is disconnected from the motor drive circuit 206 may be in response to determining that the motor disconnection time counter 234 indicates that the threshold time is reached.

In certain embodiments, if the controller 220 determines that any of the disconnection conditions 232 is not met, the controller 220 may determine whether the motor disconnection time counter 234 is more than zero seconds. In response to determining that the motor disconnection time counter 234 is more than zero seconds, the controller 220 may decrement the motor disconnection time counter 234 by a unit time. In certain embodiments, in response to determining that the set of disconnection conditions 232 is met and the motor disconnection time counter 234 has not reached the threshold time, the controller 220 may increment the motor disconnection time counter 234 by a unit time. In certain embodiments, in response to determining that the set of disconnection conditions 232 is met for more than the threshold time, the controller 220 may reset the motor disconnection time counter 234.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated with another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A system for detecting motor disconnection while a motor is switched on, comprising:
   a motor configured to operate a motor-driven component, wherein the motor is associated with a motor drive circuit that supplies power to the motor; and
   a processor communicatively coupled to the motor drive circuit, and configured to:
      determine whether a set of disconnection conditions is met for more than a threshold time, comprising:
         determine that a pulse signal that leads to powering the motor is enabled;
         determine that a modeled speed associated with the motor is more than a threshold speed, wherein the modeled speed determined is from a circuit model that represents the motor;
         determine that a drive voltage output associated with the motor drive circuit is more than a threshold voltage;
         determine that a current applied to the motor is less than a threshold current; and
         determine that a speed associated with the motor is zero; and
      in response to determining that the set of disconnection conditions is met for more than the threshold time, determine that at least one terminal of the motor is disconnected from the motor drive circuit.

2. The system of claim 1, wherein:
   the processor is further communicatively coupled to a memory configured to store a motor disconnection time counter that is set to zero, wherein the motor disconnection time counter is started when the processor initiates determining whether the set of disconnection conditions is met; and
   determining that at least one of terminals of the motor is disconnected from the motor drive circuit is further in response to determining that the motor disconnection time counter indicates that the threshold time is reached.

3. The system of claim 2, wherein the processor is further configured to:
   in response to determining that the any one or more of the set of disconnection conditions is not met, determine whether the motor disconnection time counter is more than zero seconds; and
   in response to determining that the motor disconnection time counter is more than zero seconds, decrease the motor disconnection time counter by a unit time.

4. The system of claim 2, wherein the processor is further configured to, in response to determining that the set of disconnection conditions is met and the motor disconnection time counter has not reached the threshold time, increase the motor disconnection time counter by a unit time.

5. The system of claim 2, wherein the processor is further configured to, in response to determining that the set of disconnection conditions is met for more than the threshold time, reset the motor disconnection time counter to zero.

6. The system of claim 1, wherein the set of disconnection conditions comprises:
the pulse signal that leads to powering the motor is enabled;
the modeled speed associated with the motor is more than the threshold speed;
the drive voltage output associated with the motor drive circuit is more than the threshold voltage;
the current at the motor is less than the threshold current; and
the speed associated with the motor is zero.

7. The system of claim 1, wherein:
the processor is further configured to determine an impedance associated with the motor by dividing the drive voltage output by the current; and
determining that at least one of terminals of the motor is disconnected from the motor drive circuit is further in response to determining that the impedance is more than a threshold impedance.

8. A method for detecting motor disconnection while a motor is switched on, comprising:
determining whether a set of disconnection conditions is met for more than a threshold time, comprising:
determining that a pulse signal that leads to powering the motor is enabled, wherein the motor is associated with a motor drive circuit that supplies power to the motor;
determining that a modeled speed associated with the motor is more than a threshold speed, wherein the modeled speed is determined from a circuit model that represents the motor;
determining that a drive voltage output associated with the motor drive circuit is more than a threshold voltage;
determining that a current applied to the motor is less than a threshold current; and
determining that a speed associated with the motor is zero; and
in response to determining that the set of disconnection conditions is met for more than the threshold time, determining that at least one terminal of the motor is disconnected from the motor drive circuit.

9. The method of claim 8, wherein:
the method further comprises storing a motor disconnection time counter that is set to zero, wherein the motor disconnection time counter is started when evaluating the set of disconnection conditions is initiated; and
determining that at least one of terminals of the motor is disconnected from the motor drive circuit is further in response to determining that the motor disconnection time counter indicates that the threshold time is reached.

10. The method of claim 9, further comprising:
in response to determining that the any one or more of the set of disconnection conditions is not met, determining whether the motor disconnection time counter is more than zero seconds; and
in response to determining that the motor disconnection time counter is more than zero seconds, decreasing the motor disconnection time counter by a unit time.

11. The method of claim 9, further comprising, in response to determining that the set of disconnection conditions is met and the motor disconnection time counter has not reached the threshold time, increasing the motor disconnection time counter by a unit time.

12. The method of claim 9, further comprising, in response to determining that the set of disconnection conditions is met for more than the threshold time, resetting the motor disconnection time counter to zero.

13. The method of claim 8, wherein the set of disconnection conditions comprises:
the pulse signal that leads to powering the motor is enabled;
the modeled speed associated with the motor is more than the threshold speed;
the drive voltage output associated with the motor drive circuit is more than the threshold voltage;
the current at the motor is less than the threshold current; and
the speed associated with the motor is zero.

14. The method of claim 8, wherein:
to the method further comprises determining an impedance associated with the motor by dividing the drive voltage output by the current; and
determining that at least one of terminals of the motor is disconnected from the motor drive circuit is further in response to determining that the impedance is more than a threshold impedance.

15. A non-transitory computer-readable medium storing instructions that when executed by a processor, cause the processor to:
determine whether a set of disconnection conditions is met for more than a threshold time, comprising:
determine that a pulse signal that leads to powering a motor is enabled, wherein the motor is associated with a motor drive circuit that supplies power to the motor;
determine that a modeled speed associated with the motor is more than a threshold speed, wherein the modeled speed is determined from a circuit model that represents the motor;
determine that a drive voltage output associated with the motor drive circuit is more than a threshold voltage;
determine that a current applied to the motor is less than a threshold current; and
determine that a speed associated with the motor is zero; and
in response to determining that the set of disconnection conditions is met for more than the threshold time, determine that at least one terminal of the motor is disconnected from the motor drive circuit.

16. The non-transitory computer-readable medium of claim 15, wherein:
the instructions further cause the processor to store a motor disconnection time counter that is set to zero, wherein the motor disconnection time counter is started when the processor initiates determining whether the set of disconnection conditions is met; and
determining that at least one of terminals of the motor is disconnected from the motor drive circuit is further in response to determining that the motor disconnection time counter indicates that the threshold time is reached.

17. The non-transitory computer-readable medium of claim 16, wherein the instructions further cause the processor to:
in response to determining that the any one or more of the set of disconnection conditions is not met, determine whether the motor disconnection time counter is more than zero seconds; and
in response to determining that the motor disconnection time counter is more than zero seconds, decrease the motor disconnection time counter by a unit time.

18. The non-transitory computer-readable medium of claim 15, wherein the instructions further cause the processor to communicate an alert message that indicates at least one of terminals of the motor is disconnected from the motor drive circuit in response to determining that the at least one of terminals of the motor is disconnected from the motor drive circuit.

19. The non-transitory computer-readable medium of claim 15, wherein the motor powers a motor-driven component that is a fan, a compressor, or a blower of a heating, ventilation, and air conditioning (HVAC) system.

20. The non-transitory computer-readable medium of claim 15, wherein the set of disconnection conditions comprises:
   the pulse signal that leads to powering the motor is enabled;
   the modeled speed associated with the motor is more than the threshold speed;
   the drive voltage output associated with the motor drive circuit is more than the threshold voltage;
   the current at the motor is less than the threshold current; and
   the speed associated with the motor is zero.

* * * * *